(12) United States Patent
Hirano

(10) Patent No.: US 6,414,354 B1
(45) Date of Patent: *Jul. 2, 2002

(54) SEMICONDUCTOR DEVICE HAVING A SEMICONDUCTOR LAYER WITH A CHANNEL REGION HAVING A CONTINUOUSLY INCREASING IMPURITY CONCENTRATION PROFILE

(75) Inventor: Yuuichi Hirano, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/305,278

(22) Filed: May 5, 1999

(30) Foreign Application Priority Data

Jan. 21, 1999 (JP) .......................................... 11-012880

(51) Int. Cl.[7] .............................................. H01L 27/01
(52) U.S. Cl. ........................ 257/347; 257/349; 257/354
(58) Field of Search ................................ 257/345, 347, 257/349, 354; 438/282, 149, 479, 517

(56) References Cited

U.S. PATENT DOCUMENTS

| | | | | |
|---|---|---|---|---|
| 5,238,857 A | * | 8/1993 | Sato et al. ..................... | 437/21 |
| 5,293,052 A | * | 3/1994 | Cherne ......................... | 257/349 |
| 5,401,982 A | * | 3/1995 | King et al. .................... | 257/59 |
| 5,795,813 A | * | 8/1998 | Hughes et al. ............... | 438/423 |
| 5,874,329 A | * | 2/1999 | Neary ......................... | 438/203 |

FOREIGN PATENT DOCUMENTS

| | | |
|---|---|---|
| JP | 7-221310 | 8/1995 |
| JP | 9-199716 | 7/1997 |
| JP | 10-93096 | 4/1998 |

OTHER PUBLICATIONS

F.T. Brady et al., "Total Dose Hardening Of Simox Buried Oxides For Fully Depleted Devices In Rad–Tolerant Applications", IEEE Transactions on Nuclear Science, vol. 43. No. 6, Dec. 1996, pp. 2646–2649.

* cited by examiner

Primary Examiner—Olik Chaudhuri
Assistant Examiner—Nathan W. Ha
(74) Attorney, Agent, or Firm—Oblon, Spivak, McClelland, Maier & Neustadt, P.C.

(57) ABSTRACT

An SOI layer is thickened. A channel region formed in the SOI layer has an impurity concentration profile having a single peak. The peak position is set to the depth of the interface between the SOI layer and a buried insulating layer, or set to a position deeper than that. Provision is made for improving radiation resistance and setting threshold voltage to a desirable voltage.

13 Claims, 20 Drawing Sheets

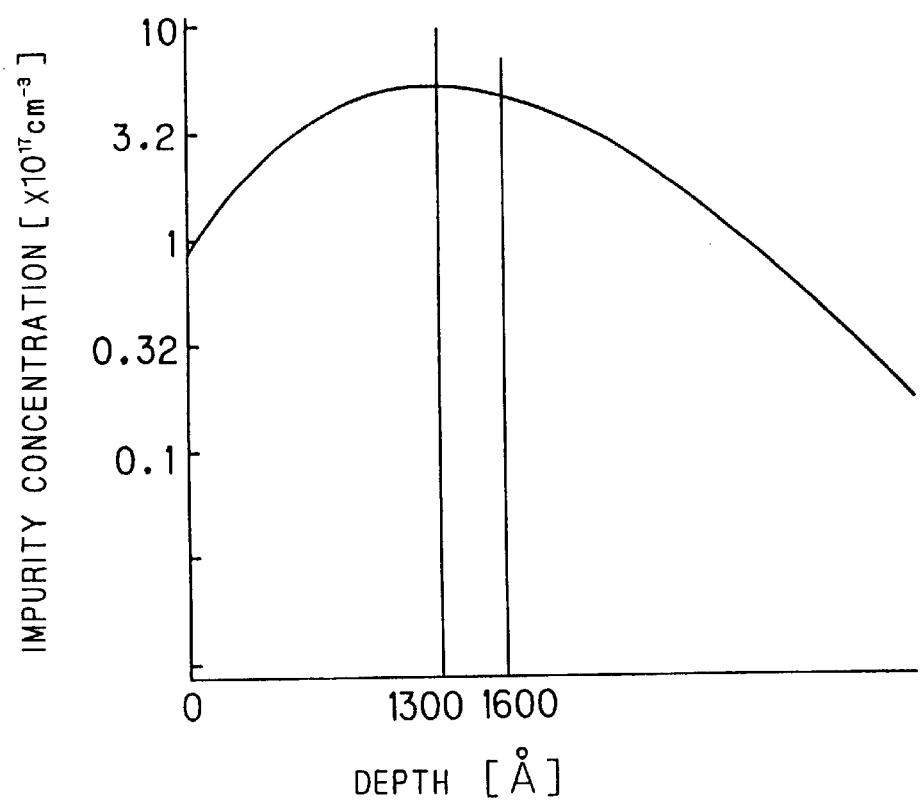
F I G. 21

US 6,414,354 B1

SEMICONDUCTOR DEVICE HAVING A SEMICONDUCTOR LAYER WITH A CHANNEL REGION HAVING A CONTINUOUSLY INCREASING IMPURITY CONCENTRATION PROFILE

BACKGROUND OF THE INVENTION

1. Field of the Invention

The present invention relates to semiconductor devices for which radiation resistance or punch through resistance is required and, more particularly, to N channel MOS transistors for which radiation resistance is required, or P channel MOS transistors for which punch through resistance is required.

2. Description of the Background Art

FIG. 22 is a graph illustrating the impurity concentration profile of a channel region underlying a gate electrode in a conventional MOS transistor. In the MOS transistor, a source region, a drain region and a channel region are formed in an SOI (Silicon On Insulator) layer. The definition of a channel region will be described later. A semiconductor layer (silicon layer) on a buried insulating layer extends to a thickness of 1000 Å from the surface of a semiconductor substrate (SOI substrate). A silicon oxide layer as a buried insulating layer is disposed beneath the SOI layer. The profile shown in FIG. 22 can be obtained by a single ion implantation of boron at an acceleration voltage of 20 keV and a dose of $4 \times 10^{12}$ cm$^{-2}$. A slight change in profile will be caused through a heat history. For example, curve L11 in FIG. 28 indicates the profile through a heat history of 15 minutes at 750° C., 20 minutes at 800° C., and 20 minutes at 850° C., from the state indicated by curve L10 that illustrates the profile immediate after ion implantation. In general, annealing is performed at the stage of manufacturing of products, to suppress a change in profile after completion of the products.

Description will be now given of a channel region underlying the gate electrode as described in conventional MOS transistors. FIG. 23 shows a layout illustrating one construction of a conventional MOS transistor. In FIG. 23 a gate electrode 2 is formed on a semiconductor substrate 1. Within the semiconductor substrate 1, a source region 3 and a drain region 4 are disposed on each side of the gate electrode 2 as viewed from above the substrate 1. Specifically, the source region 3 and the drain region 4 are formed in a region except for the region beneath the gate electrode 2 in the semiconductor substrate 1. FIG. 24 is a cross-sectional view along the line A—A of FIG. 23. Under the gate electrode 2, there is formed a gate insulating film 8 on the surface of the semiconductor substrate 1. A silicon-on-insulator (SOI) layer 7 underlies the gate insulating film 8. The SOI layer 7 extends from above a silicon oxide film 5 to below the gate insulating film 8. Part of the SOI layer 7 which is disposed beneath the gate electrode 2 as viewed from above as in FIG. 23, namely, the region that underlies the gate insulating film 8, and is surrounded by the source region 3 and the drain region 4, is referred herein as channel region. That is, the SOI layer 7 that can be seen in the cross-section of FIG. 24 is a channel region. Other elements and the above MOS transistor that are formed in the semiconductor substrate 1 are isolated by a field oxide film 6. To isolate MOS transistors from each other which are formed by using an SOI layer, there can be employed a field shield isolation gate 100 as shown in FIG. 29. For instance, an N channel MOS transistor and a P channel MOS transistor which are formed by utilizing an SOI layer 7 are isolated from each other by a field shield isolation gate 100 provided between a gate 200 of the N channel MOS transistor and a gate 201 of the P channel MOS transistor. With respect to a P channel MOS transistor and an N channel MOS transistor in FIG. 29, a channel region is formed beneath a gate insulating film 8.

In the case where a channel region of an N channel MOS transistor has an impurity concentration profile as shown in FIG. 22, it has radiation resistance as shown in FIG. 25. Referring to the graph in FIG. 25, the characteristic indicated by the broken line L1 is obtained by measuring the MOS transistor under the conditions of a radiation dose of 140 Krad and a dose rate of $1.15 \times 10^5$ rad/hr. by using γ rays from cobalt-60, and the characteristic indicted by the solid line L2 is obtained by measuring it in a room in the absence of radiation sources. At the time of measurement, the drain voltage of the MOS transistor is 2 V, and its source voltage, substrate voltage and body voltage are all 0 V. Here, the body voltage is the voltage of a channel region 7, and the substrate voltage is the voltage of an area underlying a silicon oxide film 5 of a semiconductor substrate 1. As can be seen from FIG. 25, the drain current is increased on the order of four figures by irradiating radiation when the gate voltage is 0 V.

This is because the threshold voltage of the N channel MOS transistor is reduced due to the irradiation of radiation. Upon irradiation of radiation, electron hole pairs are generated within the silicon oxide film 5. Electrons having a relatively high mobility will be cleaned out by electric field, whereas holes having a relatively low mobility will be captured by the silicon oxide film 5. The holes captured by the silicon oxide film 5 cause a decrease in the threshold voltage of the N channel MOS transistor, and thus leads to an increase in leakage voltage which involves an increase in electric power consumption.

Conventional semiconductor devices so constructed are unsuited for use in environmental conditions under which high radiation resistance is required.

SUMMARY OF THE INVENTION

According to a first aspect of the present invention, a semiconductor device comprises: an SOI substrate including a buried insulating layer and a semiconductor layer extending from above the buried insulating layer to one main surface; a gate insulating film disposed on the semiconductor layer; and a gate electrode disposed on the gate insulating film, wherein the semiconductor layer includes a channel region disposed in a region beneath the gate electrode, and source and drain regions disposed in a region except for the region beneath the gate electrode, so as to interpose the channel region therebetween; and the channel region has an impurity concentration profile peaking only at the boundary between the semiconductor layer and the buried insulating layer, or a position deeper than the boundary.

According to a second aspect of the present invention, in the semiconductor device, the semiconductor layer is not less than 1000 Å in thickness.

According to a third aspect of the present invention, the semiconductor device of the first aspect is an N channel MOS transistor.

According to a fourth aspect of the present invention, the semiconductor device of the first aspect is a P channel MOS transistor.

According to a fifth aspect of the present invention, a semiconductor device comprises: an SOI substrate including a buried insulating layer and a semiconductor layer extending from above the buried insulating layer to one main surface; a gate insulating film disposed on the semiconductor layer; and a gate electrode disposed on the gate insulating film, wherein the semiconductor layer includes a channel region of not less than 1000 Å in thickness, disposed in a region except for the region beneath the gate electrode, and source and drain regions disposed in a region except for the region beneath the gate electrode, so as to interpose the channel region therebetween; and the channel region has an impurity concentration profile peaking only in the vicinity of the boundary between the semiconductor layer and the buried insulating layer.

According to a sixth aspect of the present invention, the semiconductor device of the fifth aspect is an N channel MOS transistor.

The semiconductor device of the first or fifth aspect provides high radiation resistance or high punch through inhibition while suppressing an increase in threshold voltage.

The semiconductor device of the second aspect easily realizes the semiconductor device of the first aspect.

The semiconductor device of the third or sixth aspect reduces N channel MOS transistor errors due to radiation.

The semiconductor device of the fourth aspect reduces P channel MOS transistor malfunction due to punch through.

Accordingly, it is a principal object of the present invention to improve the radiation resistance of semiconductor devices.

These and other objects, features, aspects and advantages of the present invention will become more apparent from the following detailed description of the present invention when taken in conjunction with the accompanying drawings.

BRIEF DESCRIPTION OF THE DRAWINGS

FIG. 21 is a graph illustrating the impurity concentration profile of a channel region in a semiconductor device according to a second preferred embodiment of the invention;

DESCRIPTION OF THE PREFERRED EMBODIMENTS

Background of The Invention

Figure 22:
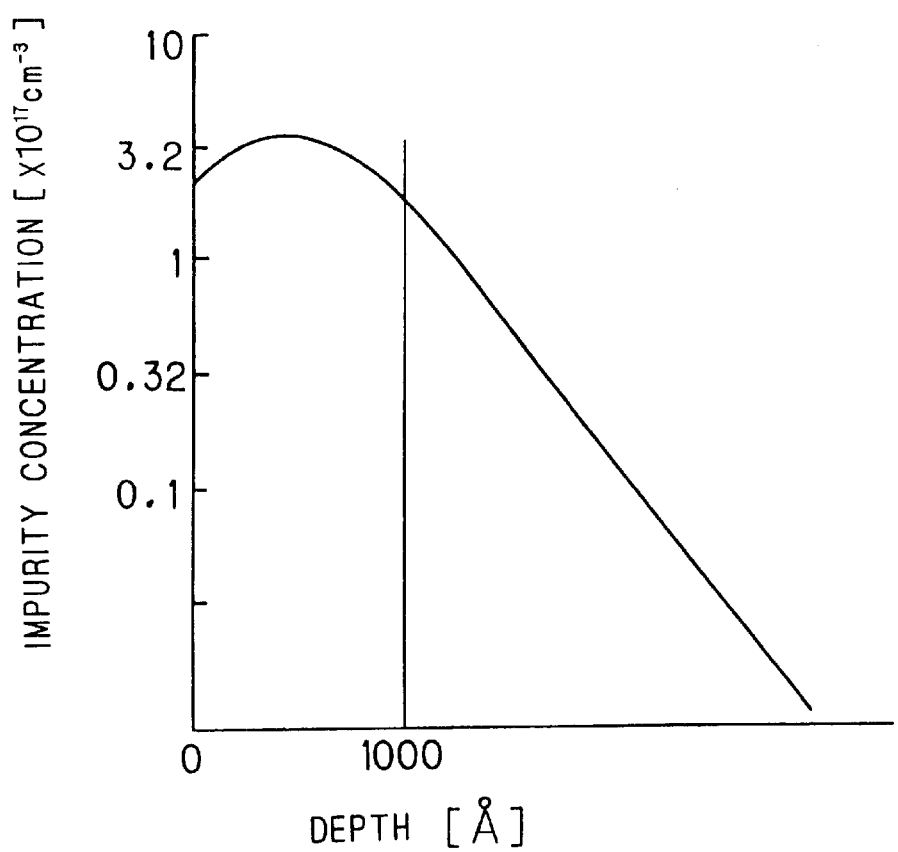
FIG. 22 is a graph illustrating the impurity concentration profile of a channel region in a conventional semiconductor device.
Figure 26:
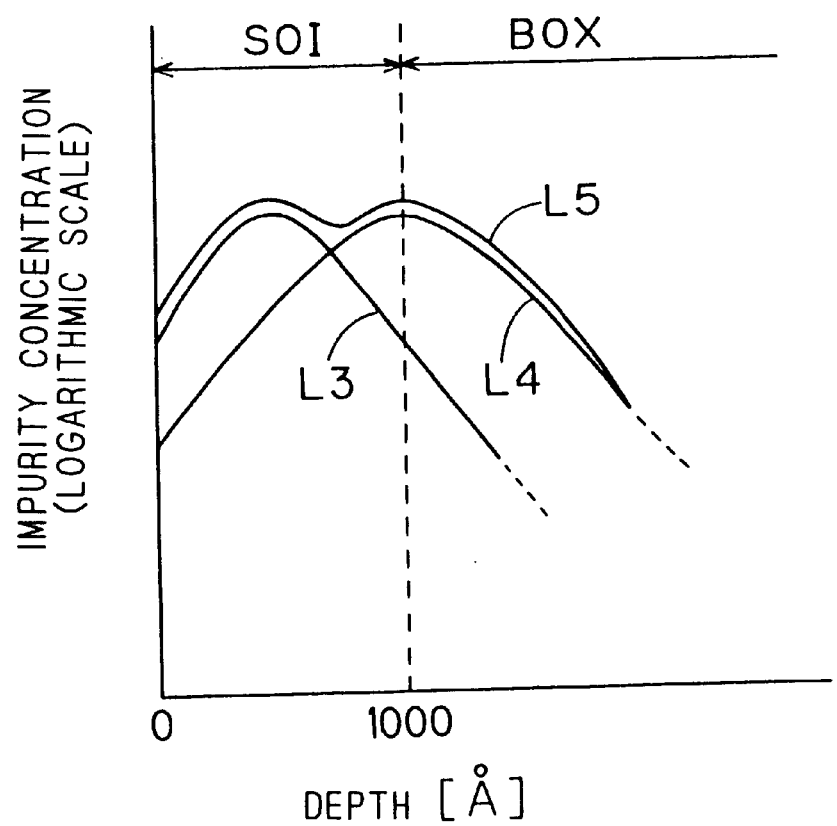
FIG. 26 is a graph illustrating the impurity concentration profile of a channel region in a semiconductor device that represents the background of the invention.

FIG. 26 is a graph illustrating the impurity concentration profile of a channel region of an N channel MOS transistor that has improvements in radiation resistance, as compared to an N channel MOS transistor having the impurity concentration profile of FIG. 22. In order to prevent an increase in threshold voltage by suppressing a depletion layer extension due to holes caused within a silicon oxide film 5, it is envisaged to increase the impurity concentration in the vicinity of the boundary between an SOI layer 7 and the silicon oxide film 5. As shown in FIG. 26, an increment of an impurity concentration profile obtained by a second ion implantation (the curve indicated by reference number L4), which profile peaks in the vicinity of the boundary, is added to an increment of an impurity concentration profile resulting from a first ion implantation for obtaining a conventional impurity concentration profile (the curve indicated by reference numeral L3), to obtain the impurity concentration profile of the curve indicated by reference numeral L5. The first ion implantation is conducted with boron under the conditions of an acceleration voltage of 20 keV and a dose of $4\times10^{12}$ cm$^{-2}$, and the second ion implantation is conducted with boron under the conditions of an acceleration voltage of 50 keV and a dose of $3\times10^{12}$ cm$^{-2}$.

Figure 25:
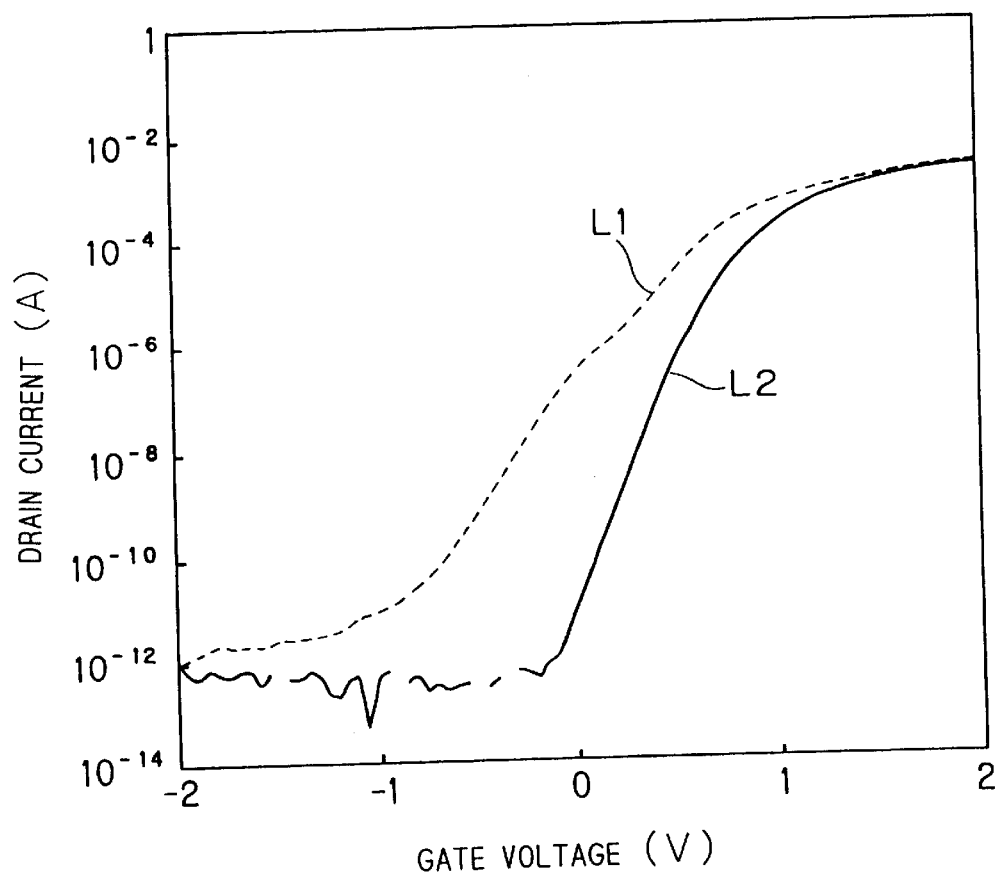
FIG. 25 is a graph illustrating the radiation resistance of the semiconductor device of FIG. 21.
Figure 27:
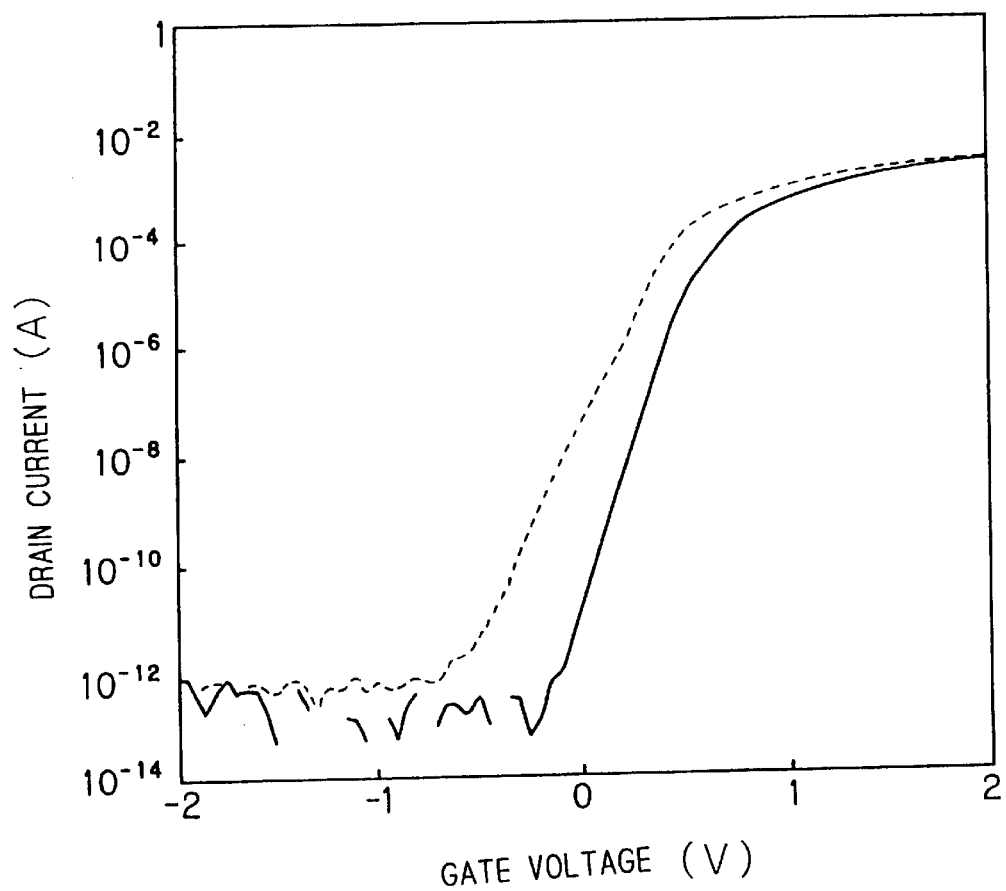
FIG. 27 is a graph illustrating the radiation resistance of the semiconductor device of FIG. 25.
Figure 28:
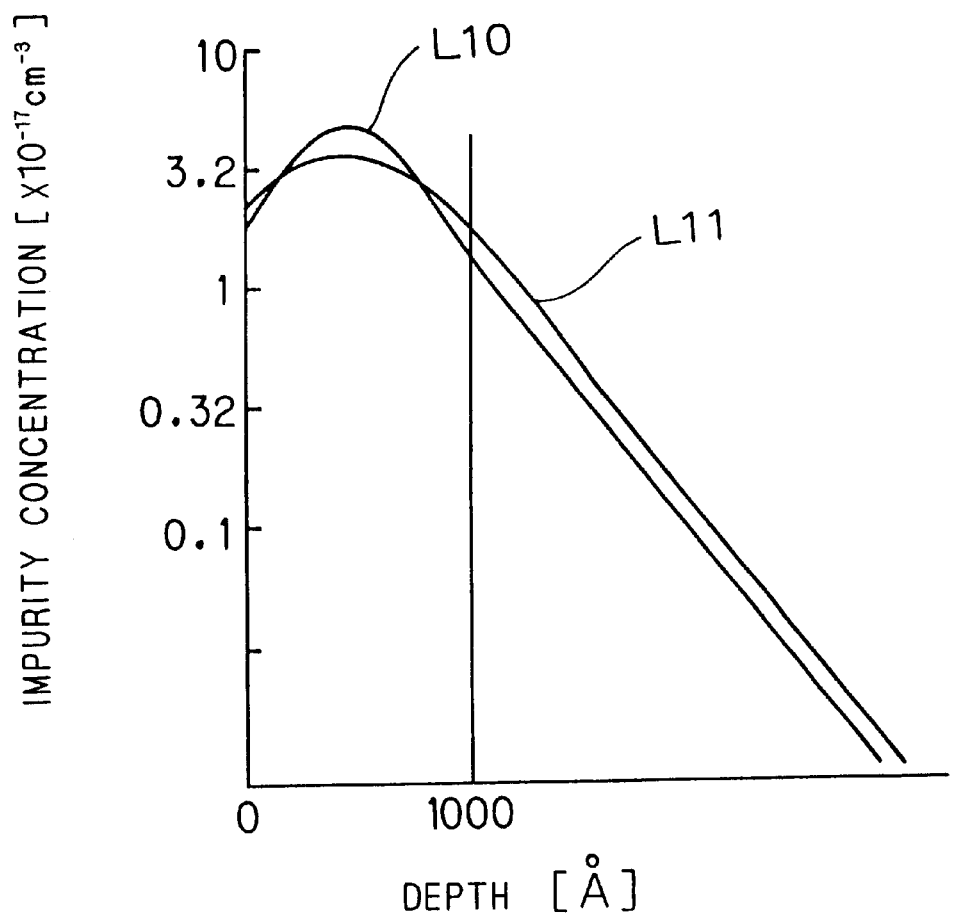
FIG. 28 is a diagram for explaining annealing.
Figure 29:
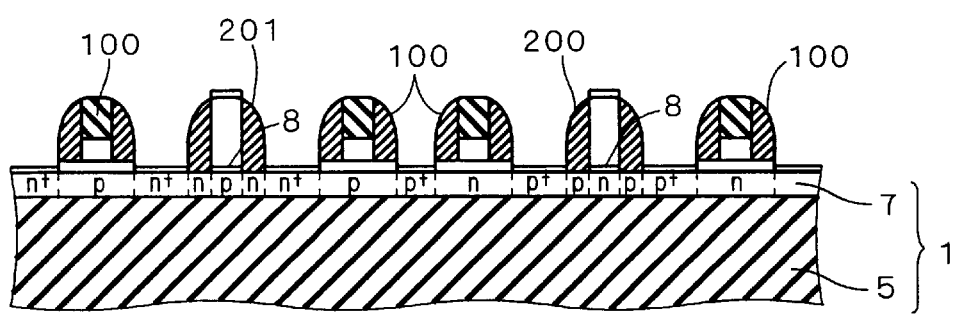
FIG. 29 is a cross-sectional view for explaining element isolation.

The N channel MOS transistor with the above-mentioned profile has radiation resistance as shown in FIG. 27. Its measuring condition is the same as described in connection with FIG. 25. Thus, by increasing the impurity concentration in the vicinity of the boundary between the SOI layer 7 and the silicon oxide film 5, the drain current at a gate voltage of 0 V, for example, in FIG. 27, is reduced than that in FIG. 25, and hence it is apparent that threshold voltage reduction due to radiation irradiation is suppressed.

The impurity concentration profile of FIG. 26 provides some improvement of radiation resistance, however, it is yet insufficient. To achieve further improvements in radiation resistance, it is effective to increase the amount of ion implantation as indicated by curve L4. However, an increase in the amount of impurity implantation by the second ion implantation will significantly increase the impurity concentration within the SOI layer 7, in particular, that in the vicinity of the surface of the SOI layer 7. This makes it difficult to control threshold voltage.

First Preferred Embodiment

Figure 1:
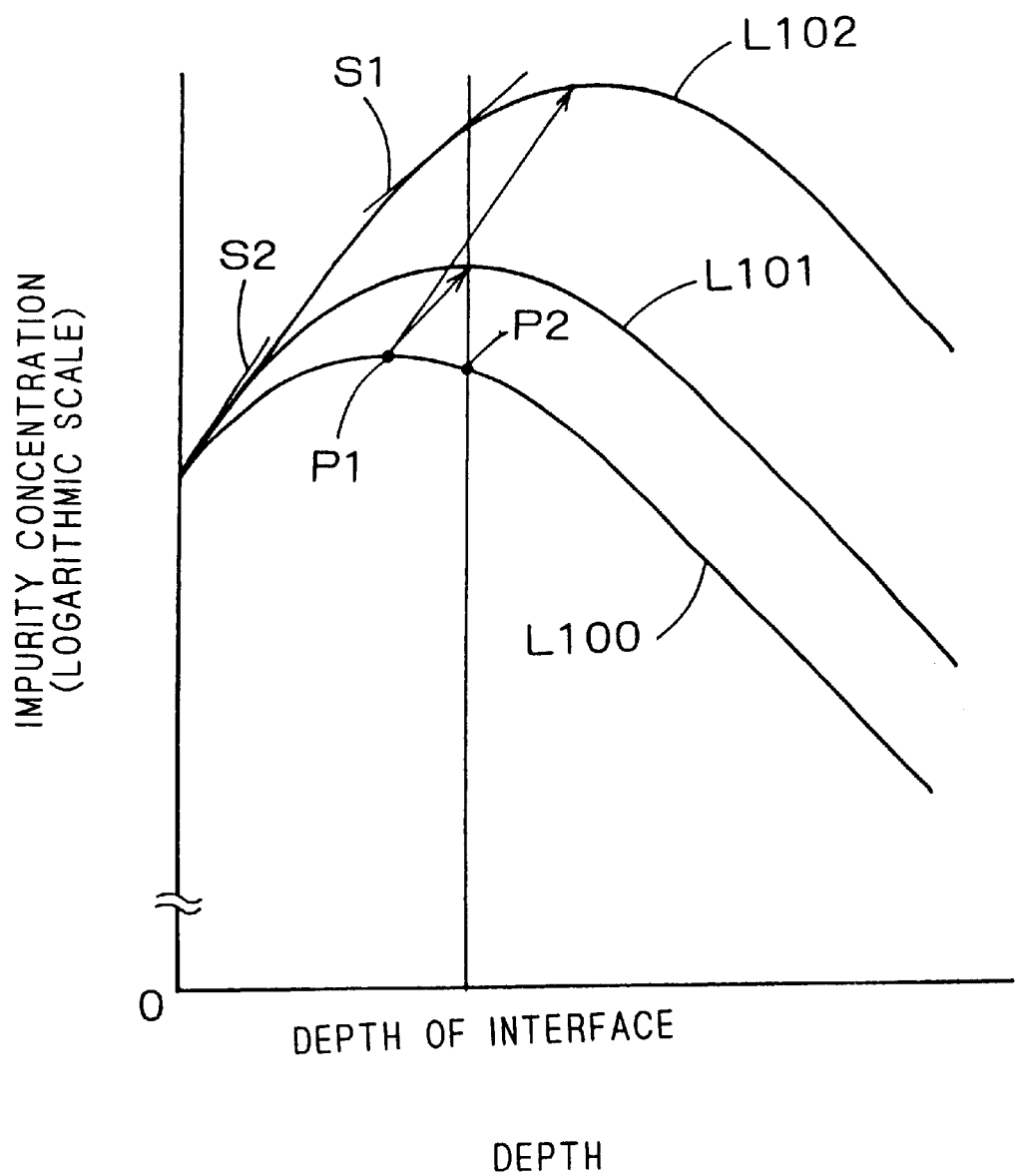
FIG. 1 is a graph illustrating the impurity concentration profile of a channel region in a semiconductor device according to a first preferred embodiment of the invention.

Description will be now given of the impurity concentration profile of a channel region of a semiconductor device according to a first preferred embodiment. FIG. 1 is a graph illustrating the impurity concentration profile of a channel region of a semiconductor device in this embodiment, in which the depth of interface refers to the depth of the interface between an SOI layer and its adjacent buried insulating layer. In the following description, when the interface between the SOI layer and the buried insulating layer is mentioned, it is referred to simply as interface. In FIG. 1, the ordinate is logarithmic scale, and curves L100 to L102 indicating impurity concentration profiles are different in the entire concentration and in a position (depth) at which they peak, however, they can be substantially overlapped by removing them in the direction indicated by the arrows. Curve L100 is an example of conventional impurity concentration profiles. As stated in the background of the invention, since the conventional profile peaks within the SOI layer, the impurity concentration at point P2 in curve L100, which is located in the depth of interface, is lower than that of peak point P1. The method described in the background of the invention aims to improve the disadvantage that the impurity concentration at point P2 will be lowered, by the second ion implantation. Unfortunately, as shown in FIG. 26, the impurity concentration shown as curve L4 indicating the impurity concentration profile formed by the second ion implantation, is added to that shown as curve L3 indicating the impurity concentration profile formed by the first ion implantation. This limits the amount of impurity capable of being implanted by the second ion implantation, making it difficult to increase the impurity concentration in the interface to the desired extent.

When compared curve L100 with curve L101, provided that the impurity concentration in the surface of the SOI layer is the same, curve L101 in which the impurity concentration profile peaks at the depth of interface can provide a higher impurity concentration in the interface than curve L100, by decrement of impurity concentration from point P1 to P2 in curve L100. Furthermore, utilizing the fact that in a curve indicating an impurity concentration profile obtained by performing an ion implantation, the slope of the curve becomes greater as it is more distant from the peak, only a single ion implantation is carried out and its impurity concentration profile is controlled so as to peak at the interface or deeper than that. For example, curve L101 peaks at the depth of interface whereas curve L102 peaks at a position deeper than the interface. Slope S1 in the vicinity of the peak in curve L102 is smaller than slope S2 that is away from the peak. Therefore, under the condition that the impurity concentration in the surface of an SOI layer is the same, curve L102 can increase the impurity concentration in the depth of interface, as compared with curve L101.

As can be seen from curves L101, L102, it is possible to improve radiation resistance while keeping threshold voltage low, by increasing the impurity concentration in the interface between the SOI layer and the buried insulating layer while keeping the impurity concentration in the surface of the SOI layer low.

Figure 2:
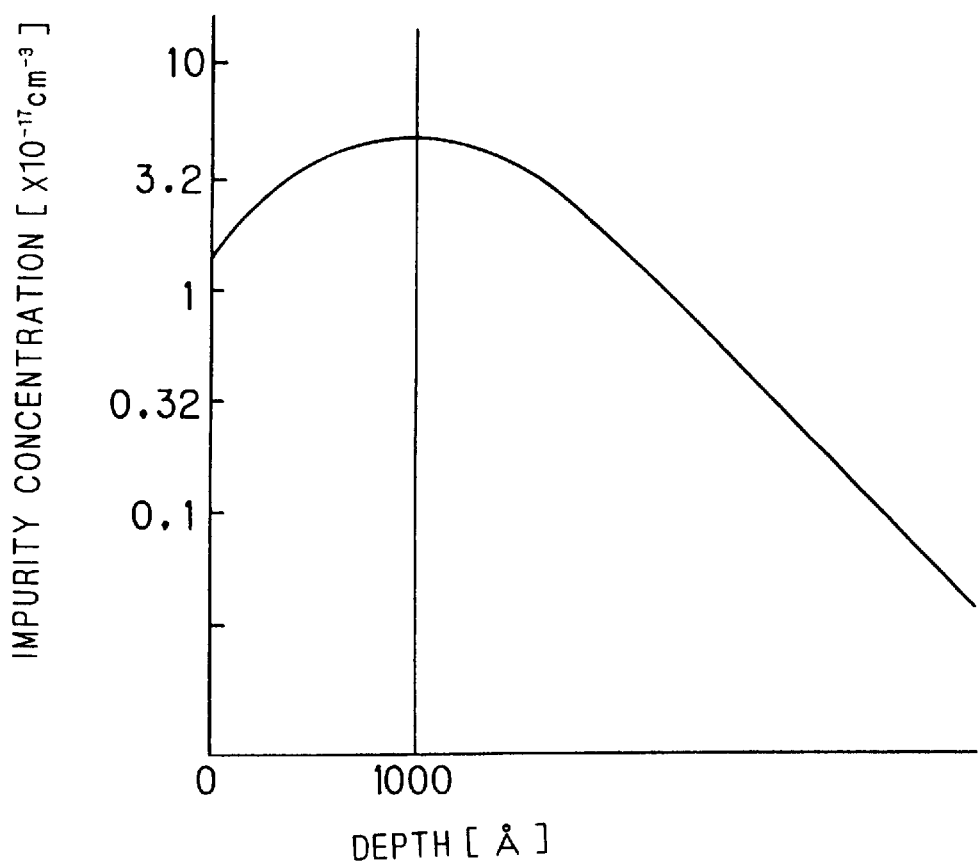
FIG. 2 is another graph illustrating the impurity concentration profile of a channel region in a semiconductor device according to the first preferred embodiment.

Description will be now given of an N channel MOS transistor having the impurity concentration profile as indicated by curve L101 in FIG. 1. FIG. 2 is a graph illustrating the impurity concentration profile of a channel region of the above N channel MOS transistor. This profile can be obtained by a single ion implantation of boron at an acceleration voltage of 35 keV and a dose of $10^{13}$ cm$^{-2}$.

Figure 3:
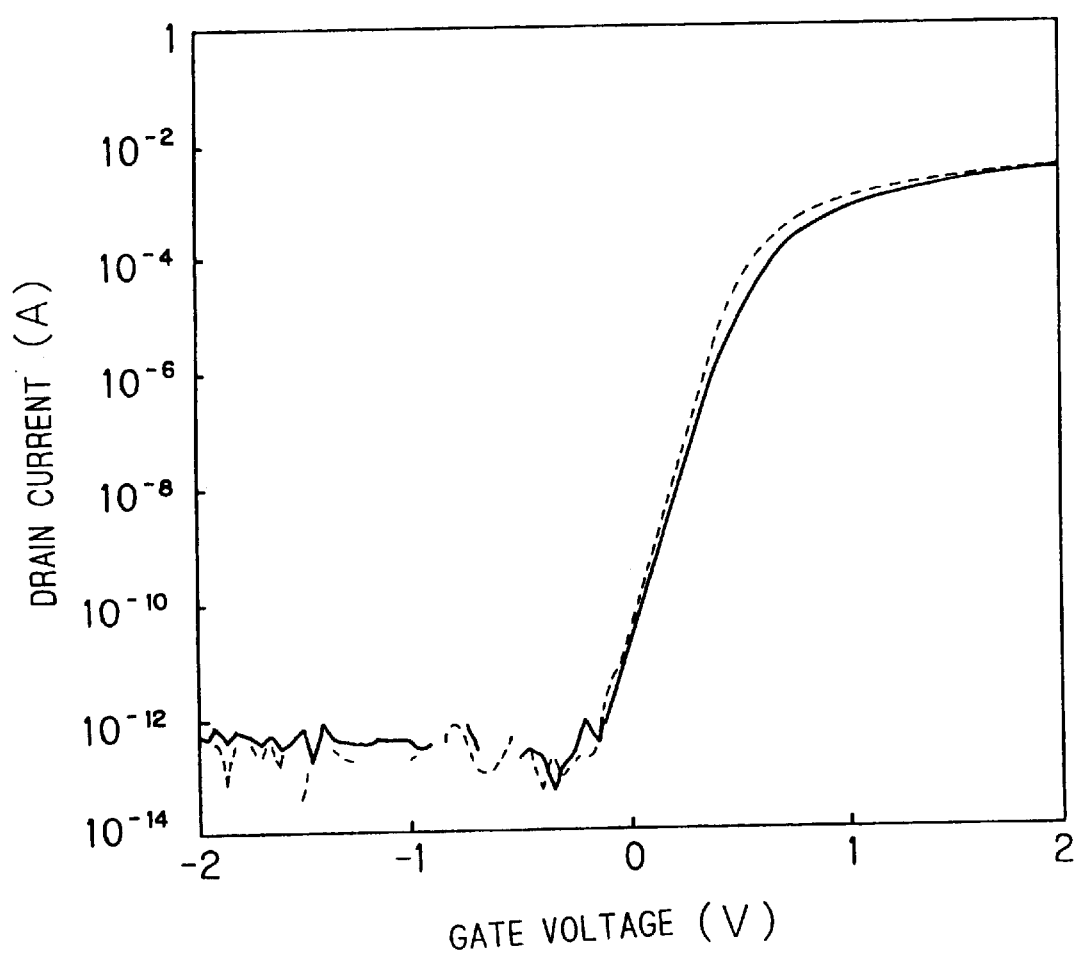
FIG. 3 is a graph illustrating the radiation resistance of the semiconductor device of FIG. 1.
Figure 23:
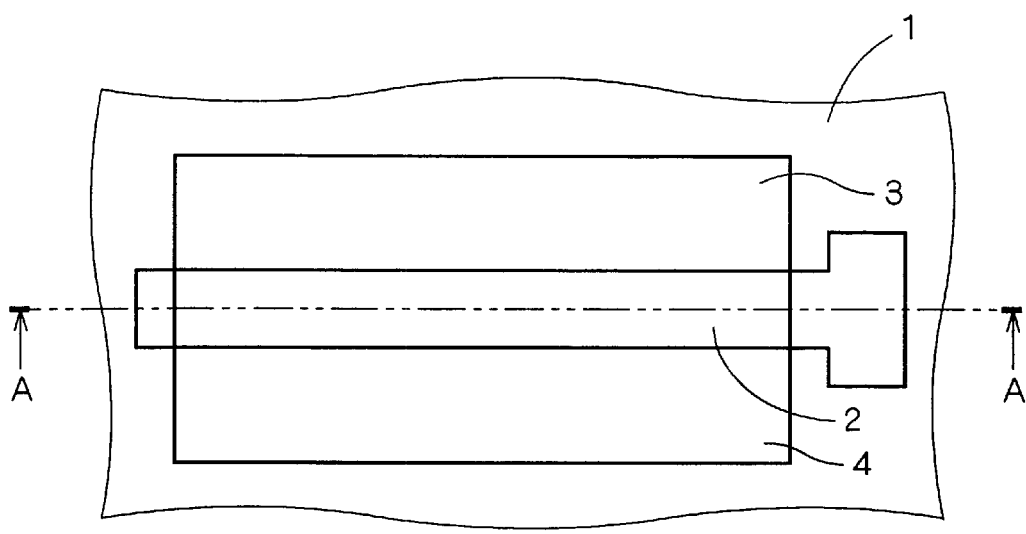
FIG. 23 is a layout diagram illustrating a planar structure of a semiconductor device.
Figure 24:
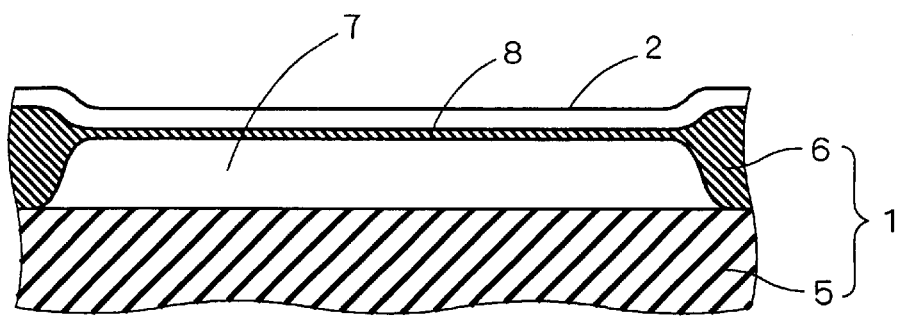
FIG. 24 is a cross-sectional view taken along the line A—A of FIG. 22.

An N channel MOS transistor of the first preferred embodiment has, for example, a silicon oxide film (buried insulating layer) 5 formed within a semiconductor substrate 1 of FIG. 24, an SOI layer (semiconductor layer) 7 that exists in the substrate 1 and extends from above the silicon oxide film 5 to one main surface of the substrate 1, a gate oxide film (gate insulating layer) 8 overlying the SOI layer 7, and a gate electrode 2 overlying the gate oxide film 8. The SOI layer 7 of this embodiment contains a channel region underlying a gate oxide film 8 shown in FIG. 24, and a source region 3 and a drain region 4, which are disposed so as to interpose the channel region therebetween (see FIG. 23). The channel region has a thickness of 1000 Å or more, and an impurity concentration which peaks only in the interface between the SOI layer 7 and the silicon oxide film 5. These features permit to provide an impurity concentration profile in which the impurity concentration in the interface is in the order of not less than $4\times10^{17}$ cm$^{-3}$. Therefore, an N channel MOS transistor whose channel region has an impurity concentration profile of FIG. 2, has radiation resistance as shown in FIG. 3. As apparent from FIG. 3, radiation resistance is improved so that the drain current is within $10^{-10}$ A at a gate voltage of 0 V. Furthermore, the channel region with the above-mentioned profile produces the effect that a shift amount in threshold voltage does not exceed 0.05 V.

From the foregoing, the semiconductor device having the impurity concentration profile of curve L101 with reference to FIG. 1, leads to the effects, and hence the semiconductor device having the impurity concentration profile of curve L102 may produce further effects.

Figure 4:
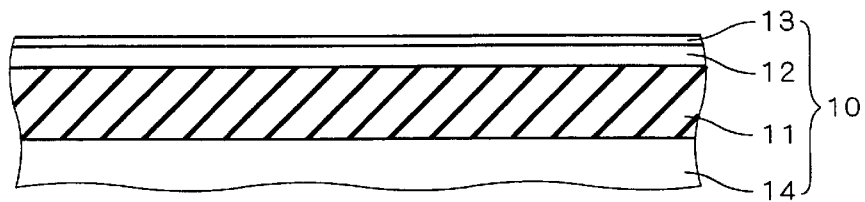
FIGS. 4 to 18 are a cross-sectional view for explaining a manufacturing step of the semiconductor device in the first preferred embodiment.

A method of manufacturing an N channel MOS transistor and a P channel MOS transistor, each having the above profile, will be described hereafter. Firstly, a wafer 10 as shown in FIG. 4 is prepared. The wafer 10 is composed of silicon, and a silicon oxide film 13 having a thickness of 300 Å is disposed on the surface of the wafer 10. Disposed beneath the silicon oxide film 13 is an SOI layer 12 of 1000 Å in thickness, and disposed beneath the SOI layer 12 is a silicon oxide film 11 of 4000 Å in thickness. The silicon oxide film 11 is formed within the wafer 10, and a silicon layer 14 underlies the silicon oxide film 11. Subsequently, a lithography operation is performed so that no photoresist is formed in a region 15 where an N channel MOS transistor will be formed, while a photoresist 17 is formed in a region 16 where a P channel MOS transistor will be formed. For channel doping of the N channel MOS transistor, boron ions are implanted into the wafer 10 in this state. Specifically, boron ions are implanted in the direction of the arrow indicated by reference numeral 18, at an acceleration voltage of 35 keV and a dose of $10^{13}$ cm$^{-2}$. After this implantation, the photoresist 17 is removed. Then, for channel doping of the P channel MOS transistor, a lithography operation is performed so that a photoresist 19 is formed in the region 15 where the N channel MOS transistor will be formed, while no photoresist is formed in the region 16 where the P channel MOS transistor will be formed. Into the wafer 10 in this state, phosphorus ions are implanted in the direction of the arrow indicated by reference numeral 20, at an acceleration voltage of 60 keV and a dose of $2.6\times10^{12}$ cm$^{-2}$. After this implantation, the photoresist 19 is removed.

Next, after the silicon oxide film 13 is removed, an oxide film 21, which is formed by using TEOS (tetraethylorthosilicate), is deposited to a thickness, e.g., 200 Å. On top of the TEOS oxide film 21, a doped polysilicon 22 is deposited to a thickness, e.g., 800 Å. A TEOS oxide film 23 is deposited to a thickness, e.g., 2000 Å, on top of the doped polysilicon 22. By using, as a mask, a photoresist 24 that is formed by lithography on top of the TEOS oxide film 23, the TEOS oxide film 23 is subjected to etching. Thereafter, the photoresist 24 is removed, followed by anisotropic etching of polysilicon. In addition, a TEOS oxide film is deposited to a thickness, e.g., 2000 Å, followed by etching, to form sidewalls 26 (see FIG. 8). This results in a field shield isolation gate 27 of FIG. 8, which serves as a gate for isolating elements.

Figure 8:
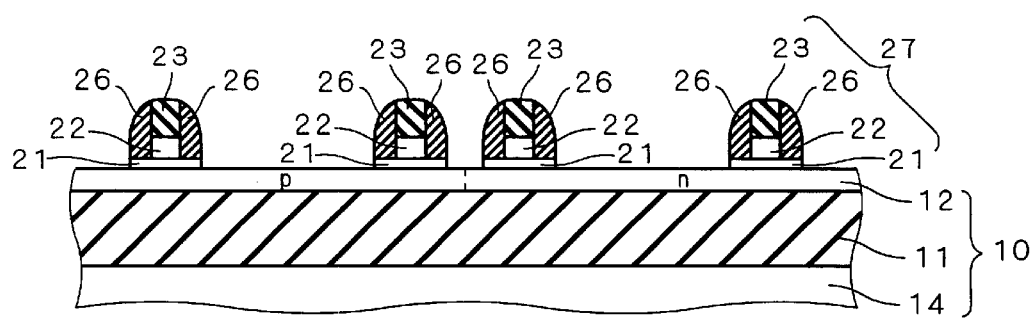
Figure 9:
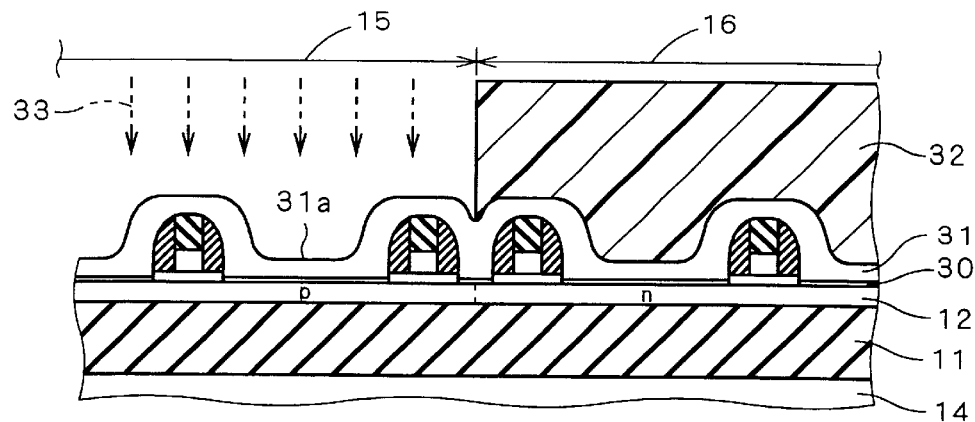

In the state of FIG. 8, a gate oxide film 30 of 70 Å in thickness is formed on the surface of the SOI layer 12, and a polysilicon 31 is deposited thereon to a thickness, e.g., several thousands of angstroms. A lithography operation is performed to dispose photoresist 32 in the region 16 where the P channel MOS transistor will be formed. With the photoresist 32 acting as a mask, arsenic ions are implanted in the direction of the arrow indicated by reference numeral 33 (see FIG. 9), at an acceleration voltage of several tens of kilo electron volts and a dose of $1\times10^{15}$ to $1\times10^{16}$ cm$^{-2}$. As a result, a polysilicon 31a in the region 15 where the N channel MOS transistor will be formed, becomes n type. After this implantation, the photoresist 32 is removed.

Figure 10:
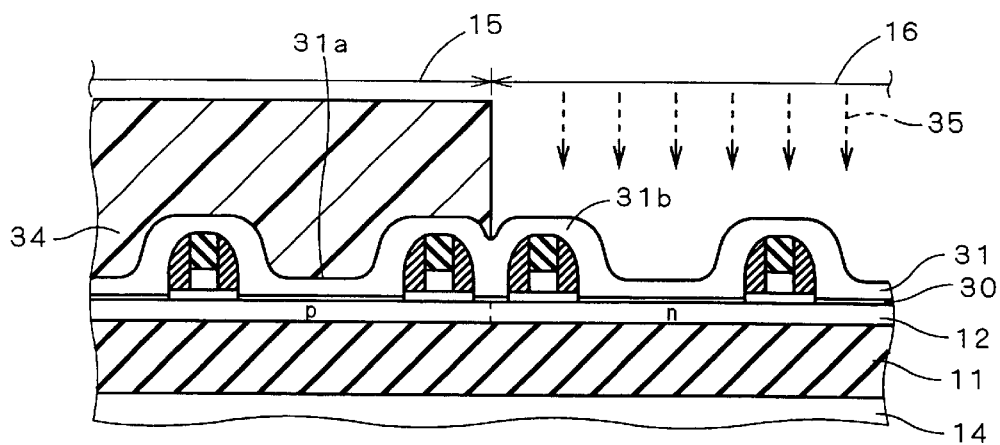
Figure 11:
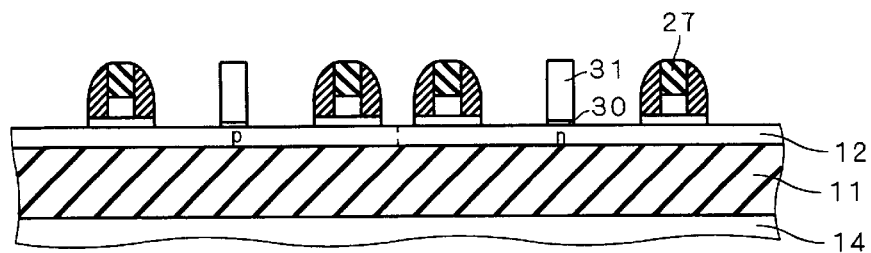

A lithography operation is performed to dispose a photoresist 34 in the region 15 where the N channel MOS transistor will be formed. With the photoresist 34 acting as a mask, boron ions are implanted in the direction of the arrow indicted by reference numeral 35 (see FIG. 10), at an acceleration voltage of several tens of kilo electron volts and a dose of $1\times10^{15}$ to $1\times10^{16}$ cm$^{-2}$. As a result, a polysilicon 31b in the region 16 where the P channel MOS transistor will be formed, becomes p type. After this implantation, the photoresist 34 is removed. Then, a photoresist used in forming a gate electrode of the MOS transistor is then disposed thereon. Anisotropic etching of polysilicon is performed with this photoresist acting as a mask. The resultant state is shown in FIG. 11.

Figure 12:
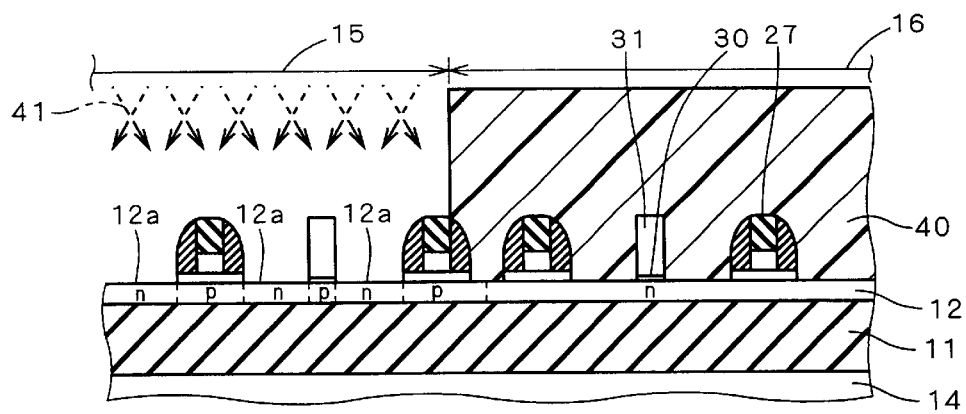

In the region 16 where the P channel MOS transistor will be formed, a photoresist 40 is disposed by lithography. With the photoresist 40 acting as a mask, the 60-degree oblique implantation of arsenic ions is conducted in the direction of the arrow indicated by reference numeral 41 (see FIG. 12), at an acceleration voltage of several tens of kilo electron volts and a dose of $1\times10^{13}$ to $5\times10^{14}$ cm$^{-2}$, so that a partial region 12a of the SOI layer 12 becomes n type. The photoresist 40 is then removed.

Figure 13:
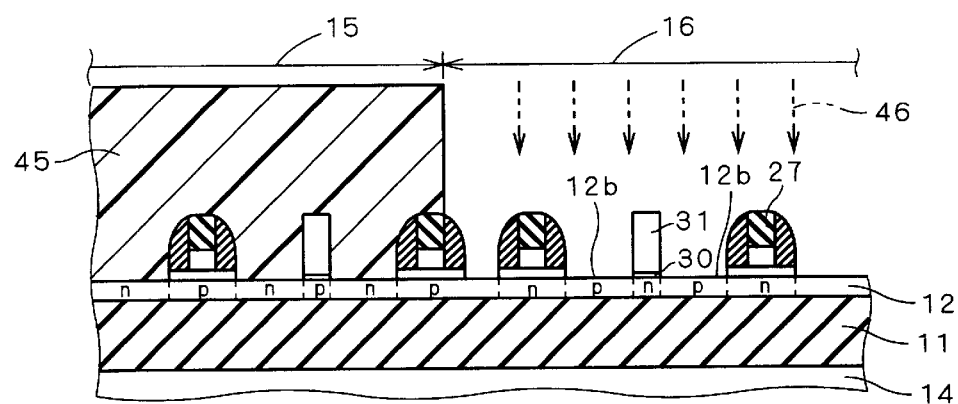

In the region 15 where the N channel MOS transistor will be formed, a photoresist 45 is disposed by lithography. With the photoresist 45 acting as a mask, boron fluoride (BF$_2$) ions are implanted in the direction of the arrow indicated by reference numeral 46 (see FIG. 13), at an acceleration voltage of several tens of kilo electron volts and a dose of $1\times10^{13}$ to $5\times10^{14}$ cm$^{-2}$, so that a partial region 12b of the SOI layer 12 becomes p type. The photoresist 45 is then removed.

Figure 14:
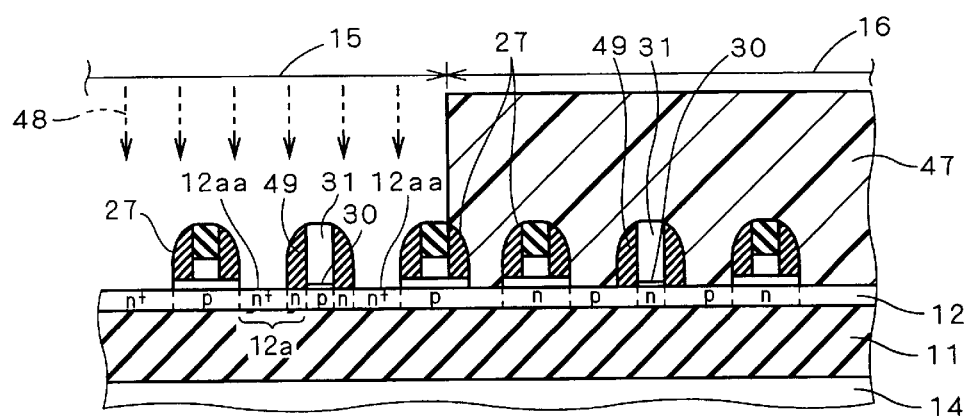

Subsequently, a TEOS oxide film is deposited to a thickness of several hundreds of angstroms. Sidewalls 49 are formed by etching. Then, in the region 16 where the P channel MOS transistor will be formed, a photoresist 47 is disposed by lithography. With the photoresist 47 acting as a mask, arsenic ions are implanted in the direction of the arrow indicated by reference numeral 48 (see FIG. 14), at an acceleration voltage of several tens of kilo electron volts and a dose of $1\times10^{15}$ to $5\times10^{15}$ cm$^{-2}$. This implantation may increase the impurity concentration of a region 12aa, which corresponds to a region except for the region underlying the sidewalls 49 in the partial region 12a of the SOI layer 12. The photoresist 47 is then removed.

Figure 15:
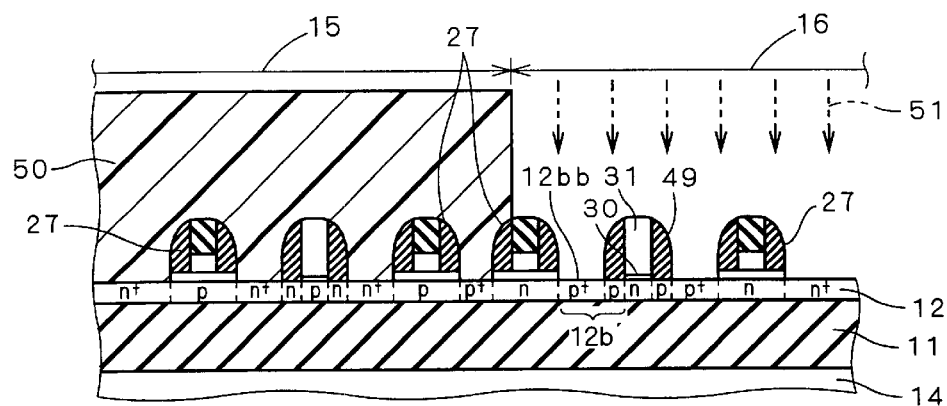

In the region 15 where the N channel MOS transistor will be formed, a photoresist 50 is disposed by lithography. With the photoresist 50 acting as a mask, boron fluoride ions are implanted in the direction of the arrow indicated by reference numeral 51 (see FIG. 15), at an acceleration voltage of several tens of kilo electron volts and a dose of $1\times10^{15}$ to $5\times10^{15}$ cm$^{-2}$. This implantation may increase the impurity concentration of a region 12bb, which corresponds to a region except for the region underlying the sidewalls 49 of the partial region 12b in the SOI layer 12. The photoresist 50 is then removed.

Figure 16:
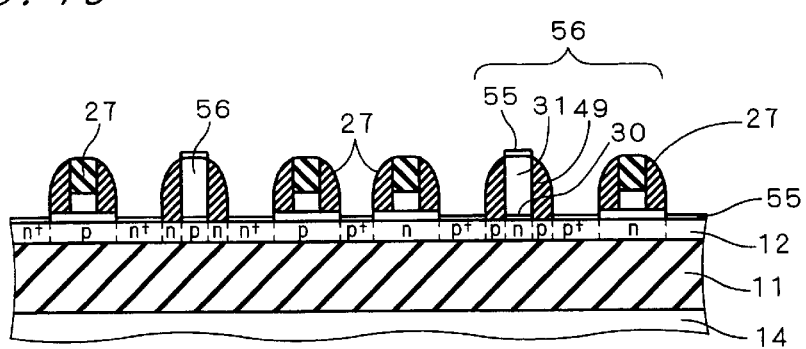

Cobalt is deposited by sputtering to a thickness of approximately 100 Å. On top of the polysilicon 31 constituting the gate electrode and on top of the SOI layer 12, cobalt silicides 55 are formed by lamp annealing in an atmosphere of nitrogen (see FIG. 16). The gate electrode 56 is constituted by the gate oxide film 30, the polysilicon 31, the sidewalls 49, and the silicides 55.

A silicate glass 60 is firstly deposited on the wafer 10 to a thickness of 1 μm, and then flattened to a thickness of approximately 5000 Å by chemical-mechanical polishing. On the resulting silicate glass 60, a phosphorus-containing silicate glass 61 is deposited to a thickness of approximately 5000 Å. A photoresist is formed by lithography over the entire surface of the silicate glass 61, except for the region where a tungsten plug is desired. With this photoresist acting as a mask, dry etching is performed to form holes 62 in the silicate glasses 60 and 61. The photoresist is then removed, resulting in the state shown in FIG. 17.

Figure 17:
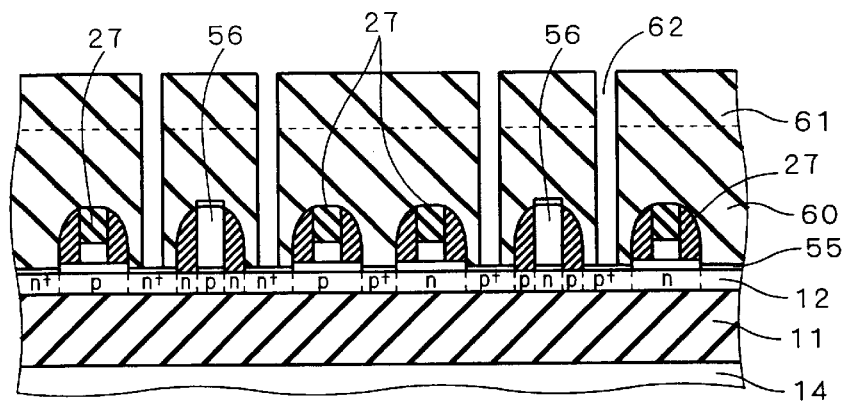
Figure 18:
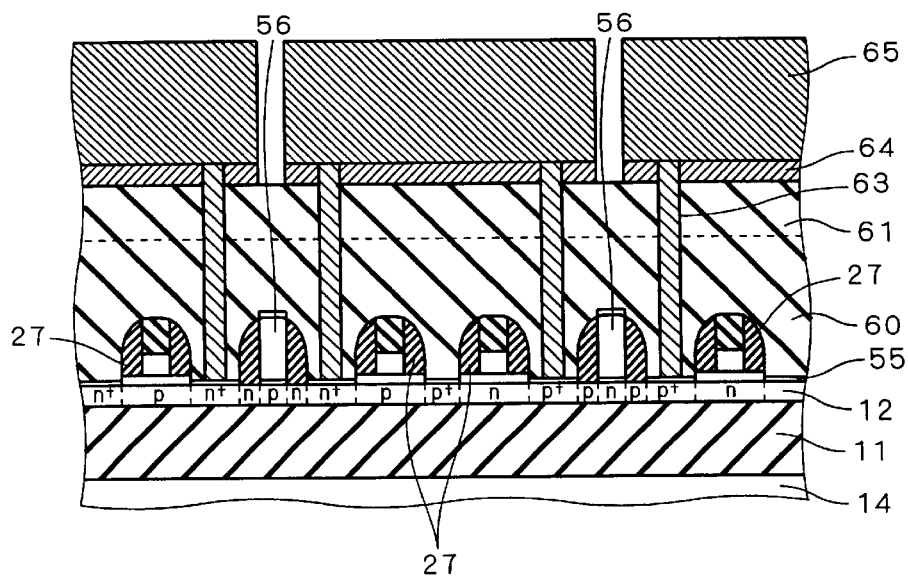

In the state of FIG. 17, titanium 64 is sputtered. In addition, tungsten is deposited to a thickness of approximately 5000 Å by CVD technique. The tungsten is then subjected to etch back to form a tungsten plug 63. On top of the titanium 64, aluminum copper is deposited to a thickness of about 0.5 μm to 1.0 μm. A photoresist is patterned by lithography. With the photoresist acting as a mask, the aluminum copper 65 is subjected to dry etching. After the aluminum copper 65 is patterned, the photoresist is removed, resulting in the state shown in FIG. 18.

Figure 5:
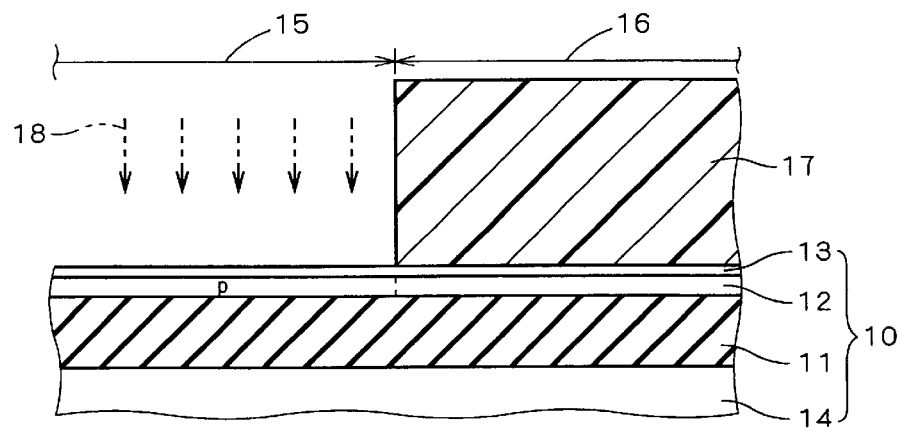
Figure 6:
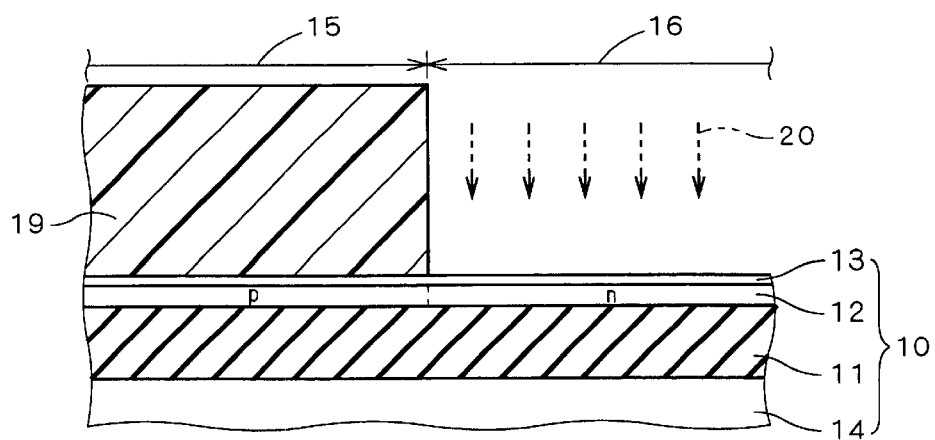
Figure 7:
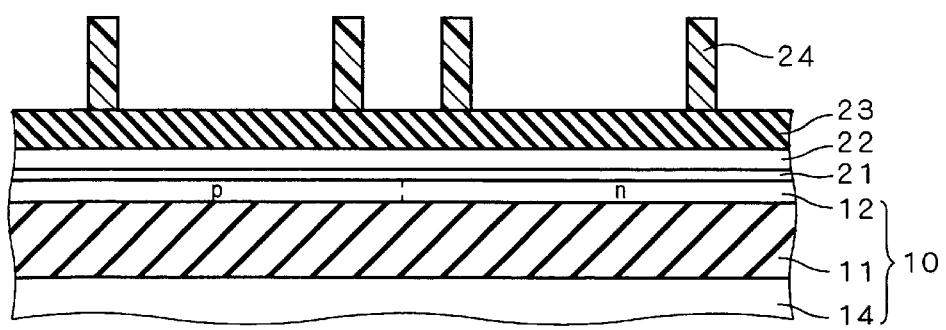

Thus, in the manufacturing steps shown in FIGS. 5 and 6, each of the impurity concentration profiles of the channel regions in the P channel MOS transistor and N channel MOS transistor is formed by a single ion implantation, which simplifies the manufacturing steps.

Figure 19:
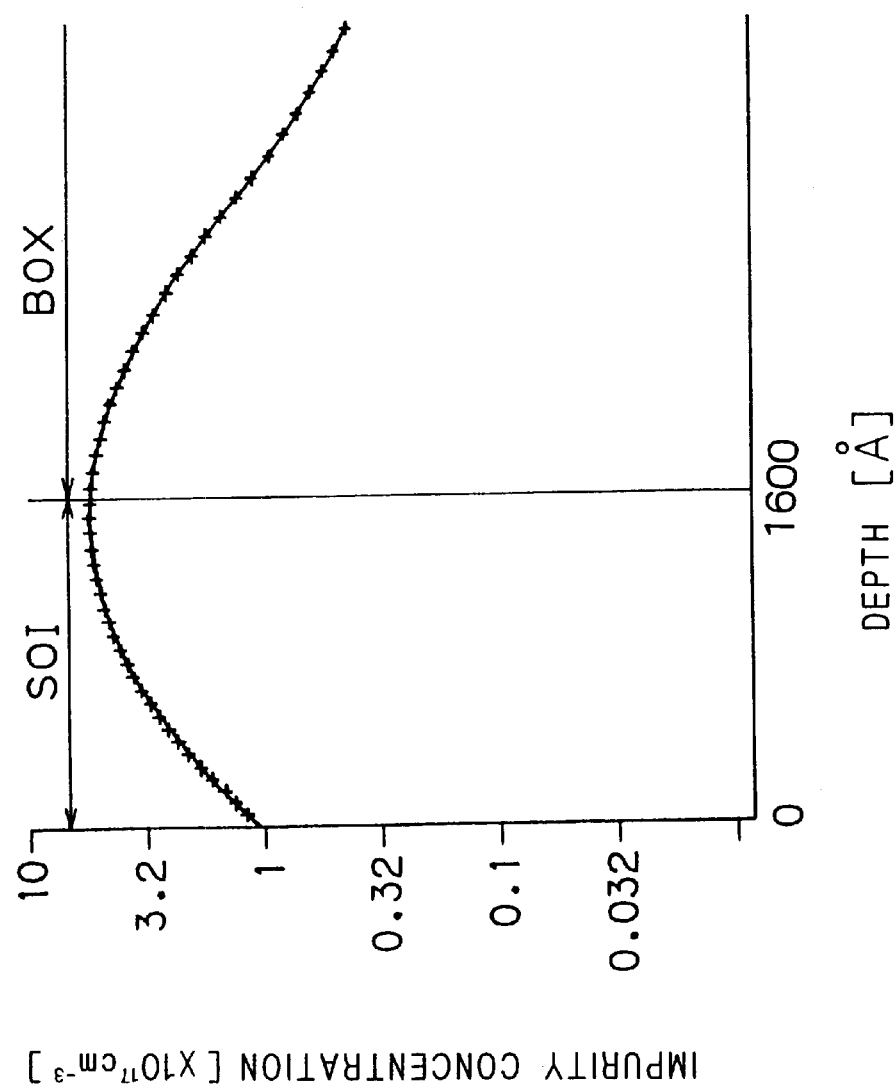
FIG. 19 is a graph illustrating one example of the impurity concentration profile of a channel region of a P channel MOS transistor according to the first preferred embodiment.
Figure 20:
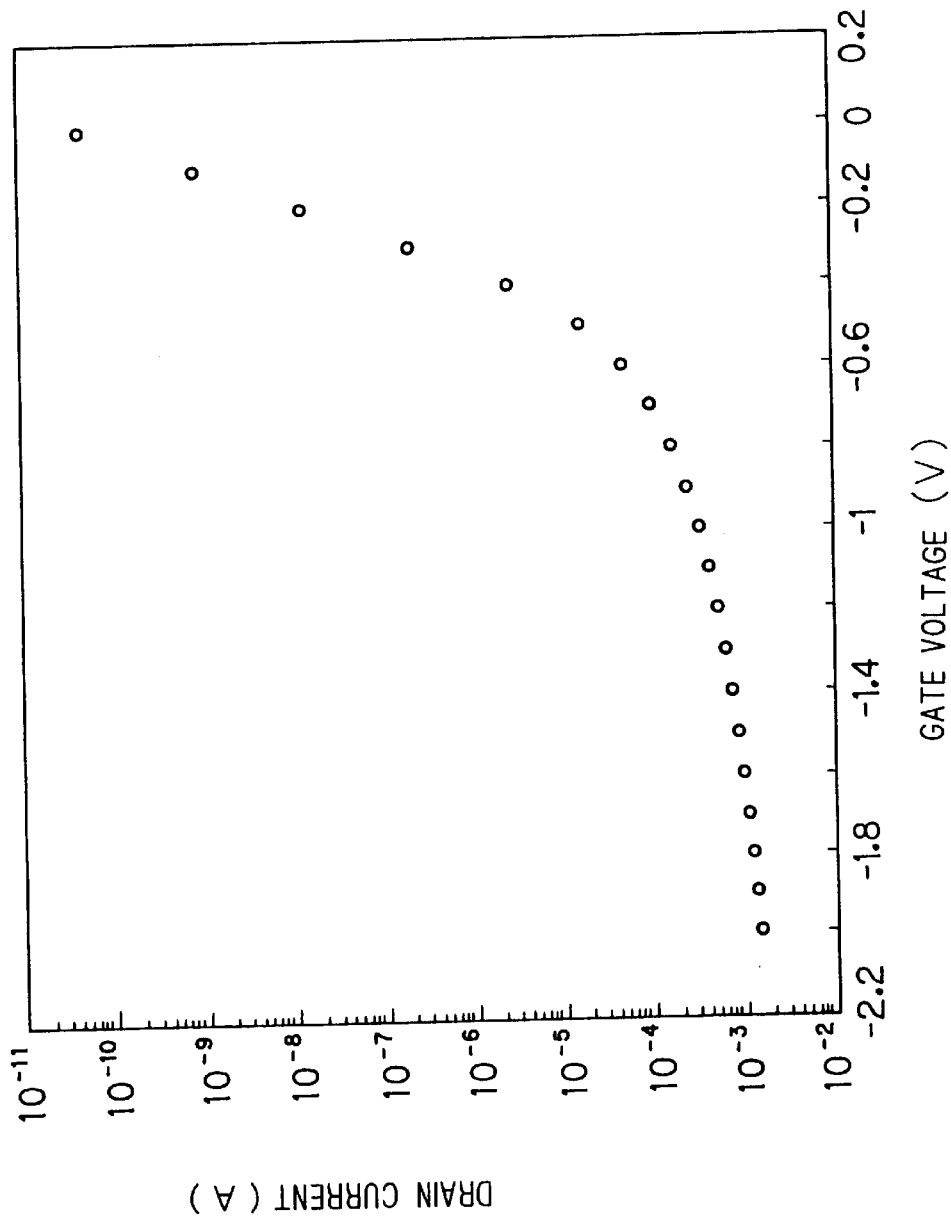
FIG. 20 is a graph illustrating the relationship between gate voltage and drain current in a P channel MOS transistor having the impurity concentration profile of FIG. 19.

Although the first preferred embodiment relates to an N channel MOS transistor, a P channel MOS transistor is also required to increase the impurity concentration in the interface between an SOI layer and a buried insulating layer, in order to suppress punch through. From the viewpoint of threshold voltage, the impurity concentration profile in the surface of the SOI layer is required to be kept low. Therefore, the impurity concentration profile as described in this embodiment inhibits punch through while keeping threshold voltages low. FIG. 19 is a graph illustrating one example of the impurity concentration of the channel region of a P channel MOS transistor. This transistor has an SOI layer of 1600 Å in thickness. The P channel MOS transistor having the impurity concentration profile of FIG. 19, which peaks between an SOI layer and a buried insulating layer, has leakage current shown in FIG. 20. The graph of FIG. 20 is obtained through measurement while applying 0 V to the source and −2 V to the drain. When the gate voltage is 0V, the drain current is a value smaller than $10^{-10}$ A. It is therefore evident that the P channel MOS transistor having the impurity concentration profile of FIG. 19 will cause no punch through.

Second Preferred Embodiment

The first preferred embodiment discusses the case where an impurity concentration profile peaks at the interface between an SOI layer and a buried insulating layer (hereinafter referred to as interface), or at a position deeper than the interface. On the other hand, a second preferred embodiment will discuss the case where an impurity concentration peaks at a position slightly shallower than the interface. For instance, an SOI layer is thicker than that of the semiconductor device of FIG. 2, and its impurity concentration peaks at the interface, to obtain a profile (hereinafter referred to as first profile), which has the same impurity concentration in the interface as that of the profile of FIG. 2. In the first profile, the impurity concentration in the surface of the SOI layer is lower than that in the profile of FIG. 2. To obtain a semiconductor device having the same threshold voltage as the profile of FIG. 2, the overall impurity concentration can be increased than the first profile. Now consider a second profile which is obtained by shifting a characteristic curve indicting the first profile in such a direction as to increase impurity concentration. In the second profile the impurity concentration in the interface is higher than that in the profile of FIG. 2. Thus, it is expected that there will be a third profile in which the impurity concentration in the surface of an SOI layer is higher than the first profile, and the impurity concentration in the interface is lower than the second profile. The third profile as described can peak at a position slightly shallower than the interface.

As an example of semiconductor devices having the third profile according to the second preferred embodiment, an N channel MOS transistor will be described by referring to FIG. 21. FIG. 21 is a graph illustrating the impurity concentration profile in a channel region of an N channel MOS transistor of the second preferred embodiment. This profile is obtained by a single ion implantation of boron at an acceleration voltage of 45 keV and a dose of $10^{13}$ cm$^{-2}$. Therefore, its impurity concentration profile peaks at a thickness of 1300 Å. This transistor has the same structure as that of the first preferred embodiment, except for the thickness of an SOI layer and the impurity concentration profile of a channel region.

The N channel MOS transistor of the second preferred embodiment in which the impurity concentration of a channel region has the profile of FIG. 21, has the radiation resistance of FIG. 3, as in the N channel MOS transistor of the first referred embodiment. In the N channel MOS transistor of the second preferred embodiment, the thickness of the channel region, namely, the SOI layer, is 1600 Å, which enables the impurity concentration profile to peak at a deeper position. If the impurity concentration in the vicinity of the SOI layer is kept low by controlling the profile so as to peak at a thickness of 1300 Å, for example, threshold voltage can be lowered to 0.3 V. On the other hand, the N channel MOS transistor in the first preferred embodiment has a threshold voltage of 0.6 V.

Thus, the N channel MOS transistor according to the second preferred embodiment can achieve a threshold voltage as low as 0.3 V, and such a high radiation resistance as shown in FIG. 3, at the same time. Furthermore, by making an SOI layer thicker than 1600 Å and controlling the impurity concentration profile so as to peak at a position thicker than 1300 Å, threshold voltage setting and radiation resistance can be improved more easily.

Although the second preferred embodiment relates to an N channel MOS transistor, the invention is applicable to P channel MOS transistors. Even in P channel MOS transistors, in some cases, an impurity concentration profile can be controlled so as to peak at a position shallower than the interface.

In addition, an N channel MOS transistor with a channel region having the impurity concentration profile of the second preferred embodiment can be formed together with a P channel MOS transistor in an identical substrate. For instance, semiconductor devices can be manufactured in the same manner as in the first preferred embodiment, only by changing the thickness of some layers and ion implantation condition at the manufacturing steps shown in FIGS. 4 to 18 with respect to the first preferred embodiment.

It is the same as prior art that impurity concentration profiles can be stabilized by annealing in the first and second preferred embodiments.

While the invention has been shown and described in detail, the foregoing description is in all aspects illustrative and not restrictive. It is therefore understood that numerous modifications and variations can be devised without departing from the scope of the invention.

I claim:

1. A semiconductor device comprising:
   an SOI substrate including a buried insulating layer and a semiconductor layer extending from above said buried insulating layer to one main surface;
   a gate insulating film disposed on said semiconductor layer; and
   a gate electrode disposed on said gate insulating film, wherein
   said semiconductor layer includes a channel region disposed in a region beneath said gate electrode, and source and drain regions disposed in a region except for said region beneath said gate electrode, so as to interpose said channel region therebetween; and
   said channel region has a continuously increasing impurity concentration profile peaking only at the boundary between said semiconductor layer and said buried insulating layer, or a position deeper than the boundary.

2. A semiconductor device according to claim 1, wherein said semiconductor layer is not less than 1000 Å in thickness.

3. A semiconductor device according to claim 1, wherein said semiconductor device is an N channel MOS transistor.

4. A semiconductor device according to claim 1, wherein said semiconductor device is a P channel MOS transistor.

5. A semiconductor device according to claim 1, wherein an implanted concentration profile of said semiconductor layer is highest at a boundary between said semiconductor layer and said buried insulating layer.

6. A semiconductor device according to claim 1, wherein substantially all of said channel region disposed between said source and drain regions has said impurity concentration profile over said channel region.

7. A semiconductor device according to claim 1, wherein substantially only said channel region disposed between boundaries of said source and drain regions has said impurity concentration profile.

8. A semiconductor device comprising:
   an SOI substrate including a buried insulating layer and a semiconductor layer extending from above said buried insulating layer to one main surface;
   a gate insulating film disposed on said semiconductor layer; and
   a gate electrode disposed on said gate insulating film, wherein
   said semiconductor layer includes a channel region of not less than 1000 Å in thickness, disposed in a region except for said region beneath said gate electrode, and source and drain regions disposed in a region except for said region beneath said gate electrode, so as to interpose said channel region therebetween; and
   said channel region has a continuously increasing impurity concentration profile peaking only in the vicinity of the boundary between said semiconductor layer and said buried insulating layer.

9. A semiconductor device according to claim 8, wherein said semiconductor device is an N channel MOS transistor.

10. A semiconductor device according to claim 8, wherein an implanted concentration profile of said semiconductor layer is highest at a boundary between said semiconductor layer and said buried insulating layer.

11. A semiconductor device according to claim 5, wherein substantially all of said channel region disposed between said source and drain regions has said impurity concentration profile over said channel region.

12. A semiconductor device according to claim 5, wherein substantially only said channel region disposed between boundaries of said source and drain regions has said impurity concentration profile.

13. A semiconductor device, comprising:

an SOI substrate having an insulating layer and a semiconductor layer formed on said insulating layer;

a gate insulating film formed on said semiconductor layer;

a gate electrode formed on said gate insulating film;

source and drain regions formed in said semiconductor layer on opposing sides of said gate electrode; and a channel region defined between said source and drain regions;

wherein a portion of said channel region interior to boundaries of said source and drain regions has a continuously increasing impurity concentration profile peaking only at a boundary between said semiconductor layer and said insulating layer, or at a position deeper than said boundary.

* * * * *